United States Patent [19]
Kawai

[11] Patent Number: 5,828,091
[45] Date of Patent: Oct. 27, 1998

[54] INTERLINE CHARGE COUPLED DEVICE SOLID STATE IMAGE SENSOR

[75] Inventor: Shinichi Kawai, Tokyo, Japan

[73] Assignee: NEC Corporation, Tokyo, Japan

[21] Appl. No.: 827,361

[22] Filed: Mar. 27, 1997

[30] Foreign Application Priority Data

Mar. 28, 1996 [JP] Japan ..................................... 8-074091

[51] Int. Cl.$^6$ ........................ H01L 27/148; H01L 29/768
[52] U.S. Cl. .......................... 257/218; 257/221; 257/232; 257/233
[58] Field of Search ................................... 257/218, 221, 257/232, 233

[56] References Cited

U.S. PATENT DOCUMENTS

| | | | |
|---|---|---|---|
| 5,455,443 | 10/1995 | Maks et al. | 257/323 |
| 5,656,875 | 8/1997 | Komobuchi | 257/232 |
| 5,668,390 | 9/1997 | Morimoto | 257/232 |

*Primary Examiner*—Ngân V. Ngô
*Attorney, Agent, or Firm*—Young & Thompson

[57] ABSTRACT

The present invention provides an interline solid state image sensor comprising the following elements. A plurality of vertical charge coupled device resistors are provided, each of which extends in a vertical direction. The vertical charge coupled device resistors are parallel to each other. A plurality of photo-diodes are aligned along one side of each of the vertical charge coupled device resistors so that the photo-diodes are aligned between adjacent two vertical charge coupled device resistors. Each of the photo-diodes is connected via a charge read-out gate region to the vertical charge coupled device resistor. Each of the vertical charge coupled device resistor comprises laminations of a first conductivity type diffusion layer and a second conductivity type diffusion layer extending under the first conductivity type diffusion layer. A lateral charge coupled resistor extends in a lateral direction. The lateral charge coupled resistor is coupled with ends of the vertical charge coupled device resistors. It is important for the present invention that the second conductivity type diffusion layer varies in impurity concentration in the lateral direction so that opposite side regions of the second conductivity type diffusion layer are higher in impurity concentration than a center region of the second conductivity type diffusion layer.

20 Claims, 2 Drawing Sheets

INTERLINE CHARGE COUPLED DEVICE SOLID STATE IMAGE SENSOR

BACKGROUND OF THE INVENTION

The present invention relates to a solid state image sensor, and more particularly to an interline charge coupled device solid state image sensor.

FIG. 1 is a plane view illustrative of an interline transfer charge coupled device solid state image sensor wherein photo-diodes and vertical charge coupled resistors are separately provided. Such solid state image sensor has been known in the art. A plurality of vertical charge coupled device resistors 102 are provided in parallel to each other over a semiconductor substrate 100. Each of the vertical charge coupled device resistors 102 extends in a vertical direction. A plurality of photo-diodes 101 are aligned in the vertical direction and along each of the vertical charge coupled device resistors 102. Namely, the photo-diodes 101 are aligned between the adjacent vertical charge coupled device resistors 102. Each of the photo-diodes 101 is connected via a charge read-out gate region 103 to the vertical charge coupled device resistor 102. A horizontal charge coupled resistor 104 is provided which extends in a lateral direction. The horizontal charge coupled resistor 104 is coupled with respective end portions of the vertical charge coupled device resistors 102. A charge detecting portion 105 is provided at an end portion of the horizontal charge coupled resistor 104. An output amplifier 106 is also provided to be coupled to the charge detecting portion 105. A unit pixel 107 is represented by the broken line and comprises the photo-diode 101 and the corresponding part of the vertical charge coupled device resistors 102.

When light is incident onto the photo-diode 101, a photoelectric conversion of the photo-diode 101 is caused to convert the incident light into charge. The photoelectric-converted charge is transferred through the charge read-out gate region 103 into the vertical charge coupled device resistors 102. The photoelectric-converted charge is further transferred through the horizontal charge coupled resistor 104 into the charge detecting portion 105. The photoelectric-converted charge is then outputted through the output amplifier 106.

FIG. 2 is a fragmentary cross sectional elevation view illustrative of the unit pixel 107 of the interline solid state image sensor. A p$^-$-well region 2 is formed over an n-type silicon substrate 1. An n-type photoelectric converter 3 is formed over the p$^-$-well region 2. The n-type photoelectric converter 3 constitutes the photo-diode 101. A p$^+$-diffusion layer 4 is provided over the n-type photoelectric converter 3 for reduction of dark current. The vertical charge coupled device resistors 102 comprises an n-type diffusion layer 5 over the n-type silicon substrate 1 and a p-type diffusion layer 6 underlying the n-type diffusion layer 5 and in the upper region of the n-type silicon substrate 1. Between the photo-diode 101 and the corresponding vertical charge coupled device resistors 102, a charge read-out gate region 8 is provided. A p$^+$-type isolation layer 7 is provided at an opposite side of the photo-diode 101 to the charge read-out gate region 8. An insulation film 9-1 is formed which extends over the p$^+$-diffusion layer 4, the n-type diffusion layer 5, the p$^+$-type isolation layer 7. The insulation film 9-1 may comprise a silicon oxide film or a silicon nitride film. A transfer gate electrode 10 of the vertical charge coupled device resistors 102 is provided on the insulation film 9-1 and over the n-type diffusion layer 5. The transfer gate electrode 10 may comprise a polysilicon film. An insulation film 9-2 is further provided over the transfer gate electrode 10. An optical shielding film 11 is provided over the insulation film 9-2. The optical shielding film 11 may comprise a tungsten film or an aluminum film.

The charge or electrons having been read out from the photo-diode is then transferred through the vertical charge coupled device resistor, if electrons generated by incidence of light onto the photo-diode enter into the n-type diffusion layer of the vertical charge coupled device resistor via the p-type diffusion layer underlying the n-type diffusion layer, then a problem with smear as a dummy signal occurs. One of the causes of the smear is that electrons having been generated in the p$^-$-type well around the n-type diffusion layer are diffused to enter into the n-type diffusion layer. In order to prevent electrons from entry into the n-type diffusion layer, the p-type diffusion layer is formed under the n-type diffusion layer so as to form a potential barrier to electrons. The potential barrier serves to suppress electrons from being diffused to enter into the n-type diffusion layer. In order to decrease smear, it is effective to increase the impurity concentration of the p-type diffusion layer so that the height of the potential barrier is increased. If, however, the impurity concentration of the p-type diffusion layer is increased, then a fringe electric field becomes weak due to charge transfer, for which reason the efficiency of the charge transfer of the vertical charge coupled device resistor is deteriorated. If a potential difference of the n-type diffusion layer under the transfer gate electrode is small, then the intensity of the fringe electric field is weak. The potential difference of the n-type diffusion layer depends upon a ratio of a first capacitance C1 to a second capacitance C2, wherein the first capacitance C1 is defined between the transfer gate electrode and the n-type diffusion layer and the second capacitance C2 is a p-n junction capacitance defined between the n-type diffusion layer and the p-type diffusion layer. If the second capacitance C2 becomes larger than the first capacitance C1, then the potential difference of the n-type diffusion layer is small. If the impurity concentration of the p-type diffusion layer is decreased, then the second capacitance C2 is increased whereby the fringe electric field becomes.

In the above circumstances, it had been required to develop a novel interline charge coupled device solid state image sensor to achieve a substantial decrease in smear as well as allowing an improvement in the charge transfer efficiency.

SUMMARY OF THE INVENTION

Accordingly, it is an object of the present invention to provide a novel interline charge coupled device solid state image sensor free from any disadvantages as described above.

It is a further object of the present invention to provide a novel interline charge coupled device solid state image sensor to achieve a substantial decrease in smear.

It is a further more object of the present invention to provide a novel interline charge coupled device solid state image sensor, which allows an improvement in charge transfer efficiency.

The above and other objects, features and advantages of the present invention will be apparent from the following descriptions.

The present invention provides an interline solid state image sensor comprising the following elements. A plurality of vertical charge coupled device resistors are provided, each of which extends in a vertical direction. The vertical charge coupled device resistors are parallel to each other. A plurality of photo-diodes are aligned along one side of each of the vertical charge coupled device resistors so that the photo-diodes are aligned between adjacent two vertical charge coupled device resistors. Each of the photo-diodes is connected via a charge read-out gate region to the vertical charge coupled device resistor. Each of the vertical charge coupled device resistor comprises laminations of a first conductivity type diffusion layer and a second conductivity type diffusion layer extending under the first conductivity type diffusion layer. A horizontal charge coupled resistor extends in a horizontal direction. The horizontal charge coupled resistor is coupled with ends of the vertical charge coupled device resistors. It is important for the present invention that the second conductivity type diffusion layer varies in impurity concentration in the horizontal direction so that opposite side regions of the second conductivity type diffusion layer are higher in impurity concentration than a center region of the second conductivity type diffusion layer.

BRIEF DESCRIPTIONS OF THE DRAWINGS

Preferred embodiments according to the present invention will be described in detail with reference to the accompanying drawings.

DISCLOSURE OF THE INVENTION

Figure 1:
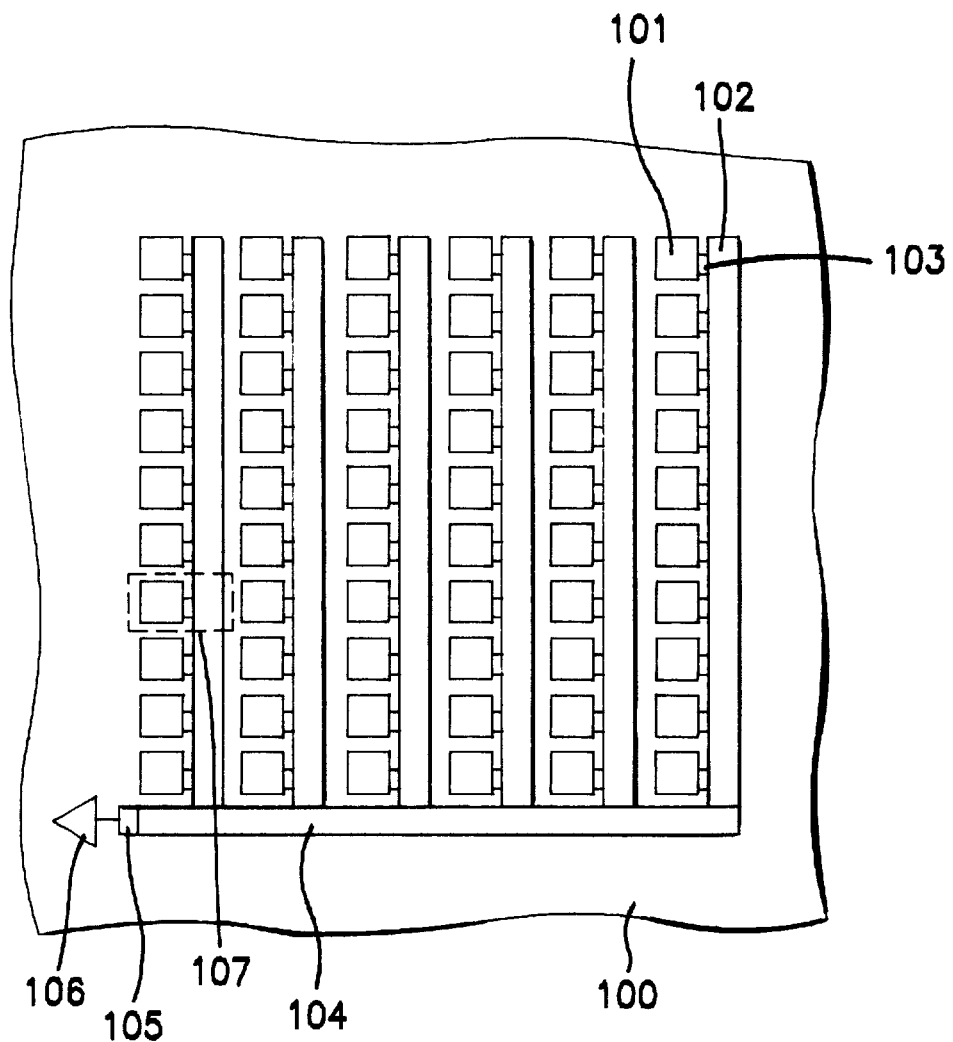
FIG. 1 is a plane view illustrative of the interline transfer charge coupled device solid state image sensor wherein photo-diodes and vertical charge coupled resistors are separately provided.
Figure 2:
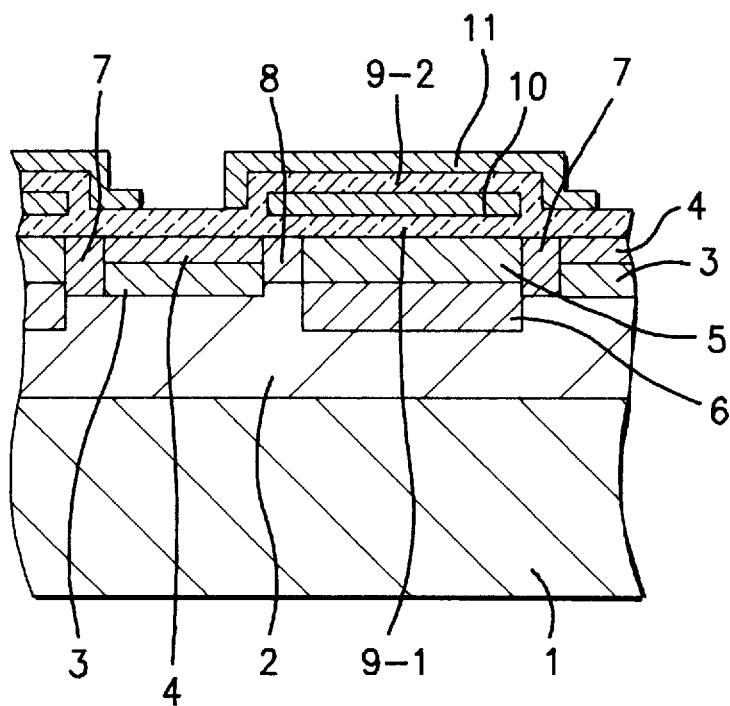
FIG. 2 is a fragmentary cross sectional elevation view illustrative of the unit pixel of the conventional interline charge coupled device solid state image sensor.

The present invention provides a vertical charge coupled device resistor formed in an upper region of a semiconductor substrate of an interline solid state image sensor. The vertical charge coupled device resistor comprises laminations of a first conductivity type diffusion layer and a second conductivity type diffusion layer extending under the first conductivity type diffusion layer, wherein the second conductivity type diffusion layer varies in impurity concentration in a width direction so that opposite side regions of the second conductivity type diffusion layer are higher in impurity concentration than a center region of the second conductivity type diffusion layer.

It is preferable that the second conductivity type diffusion layer comprises a first region having a first impurity concentration, a second region extending in contact with a first side of the first region, the second region having a second impurity concentration higher than the first impurity concentration, and a third region extending in contact with a second side of the first region, the third region having a third impurity concentration higher than the first impurity concentration.

It is also preferable that the second and third impurity concentrations are the same as each other.

It is also preferable that the first impurity concentration is approximately $0.8 \times 10^{16}$ cm$^{-3}$, and the second and third impurity concentrations are approximately $2.0 \times 10^{16}$ cm$^{-3}$, and wherein the first conductivity type diffusion layer has an impurity concentration of approximately $1.0 \times 10^{17}$ cm$^{-3}$.

It is also preferable that the first impurity concentration is approximately $1.2 \times 10^{16}$ cm$^{-3}$, and the second and third impurity concentrations are approximately $2.0 \times 10^{16}$ cm$^{-3}$, and wherein the first conductivity type diffusion layer has an impurity concentration of approximately $1.0 \times 10^{17}$ cm$^{-3}$.

It is also preferable that the second conductivity type diffusion layer increases in impurity concentration toward opposite sides thereof.

It is also preferable that a majority carrier is electron and the first conductivity type is n-type and the second conductivity type is p-type.

The present invention provides an interline solid state image sensor comprising the following elements. A plurality of vertical charge coupled device resistors are provided, each of which extends in a vertical direction. The vertical charge coupled device resistors are parallel to each other. A plurality of photo-diodes are aligned along one side of each of the vertical charge coupled device resistors so that the photo-diodes are aligned between adjacent two vertical charge coupled device resistors. Each of the photo-diodes is connected via a charge read-out gate region to the vertical charge coupled device resistor. Each of the vertical charge coupled device resistors comprises laminations of a first conductivity type diffusion layer and a second conductivity type diffusion layer extending under the first conductivity type diffusion layer. A horizontal charge coupled resistor extends in a horizontal direction. The horizontal charge coupled resistor is coupled with ends of the vertical charge coupled device resistors. It is important for the present invention that the second conductivity type diffusion layer varies in impurity concentration in the horizontal direction so that opposite side regions of the second conductivity type diffusion layer are higher in impurity concentration than a center region of the second conductivity type diffusion layer.

It is also preferable that the second conductivity type diffusion layer comprises a first region having a first impurity concentration, a second region extending in contact with a first side of the first region and having a second impurity concentration higher than the first impurity concentration, and a third region extending in contact with a second side of the first region and having a third impurity concentration higher than the first impurity concentration.

It is also preferable that the second and third impurity concentrations are the same as each other.

It is also preferable that the first impurity concentration is approximately $0.8 \times 10^{16}$ cm$^{-3}$, and the second and third impurity concentrations are approximately $2.0 \times 10^{16}$ cm$^{-3}$, and wherein the first conductivity type diffusion layer has an impurity concentration of approximately $1.0 \times 10^{17}$ cm$^{-3}$.

It is also preferable that the first impurity concentration is approximately $1.2 \times 10^{16}$ cm$^{-3}$, and the second and third impurity concentrations are approximately $2.0 \times 10^{16}$ cm$^{-3}$, and wherein the first conductivity type diffusion layer has an impurity concentration of approximately $1.0 \times 10^{17}$ cm$^{-3}$.

It is also preferable that the second conductivity type diffusion layer increases in impurity concentration toward opposite sides thereof.

It is also preferable that a majority carrier is electron and the first conductivity type is n-type and the second conductivity type is p-type.

PREFERRED EMBODIMENT

A first embodiment according to the present invention will be described in detail with reference to FIGS. 1 and 3 which is illustrative of the unit pixel of a novel interline charge coupled device solid state image sensor which achieves a substantial decrease in smear as well as allowing an improvement in the charge transfer efficiency.

The novel interline charge coupled device solid state image sensor has the same structure as illustrated in FIG. 1. A plurality of vertical charge coupled device resistors 102 are provided in parallel to each other over a semiconductor substrate 100. Each of the vertical charge coupled device resistors 102 extends in a vertical direction. A plurality of photo-diodes 101 are aligned in the vertical direction and along each of the vertical charge coupled device resistors 102. Namely, the photo-diodes 101 are aligned between the adjacent vertical charge coupled device resistors 102. Each of the photo-diodes 101 is connected via a charge read-out gate region 103 to the vertical charge coupled device resistor 102. A horizontal charge coupled resistor 104 is provided which extends in a horizontal direction. The horizontal charge coupled resistor 104 is coupled with respective end portions of the vertical charge coupled device resistors 102. A charge detecting portion 105 is provided at an end portion of the horizontal charge coupled resistor 104. An output amplifier 106 is also provided to be coupled to the charge detecting portion 105. A unit pixel 107 is represented by the broken line and comprises the photo-diode 101 and the corresponding part of the vertical charge coupled device resistors 102.

When light is incident into the photo-diode 101, a photoelectric conversion of the photo-diode 101 is caused to convert the incident light into charge. The photoelectric-converted charge is transferred through the charge read-out gate region 103 into the vertical charge coupled device resistors 102. The photoelectric-converted charge is further transferred through the horizontal charge coupled resistor 104 into the charge detecting portion 105. The photoelectric-converted charge is then outputted through the output amplifier 106.

Figure 3:
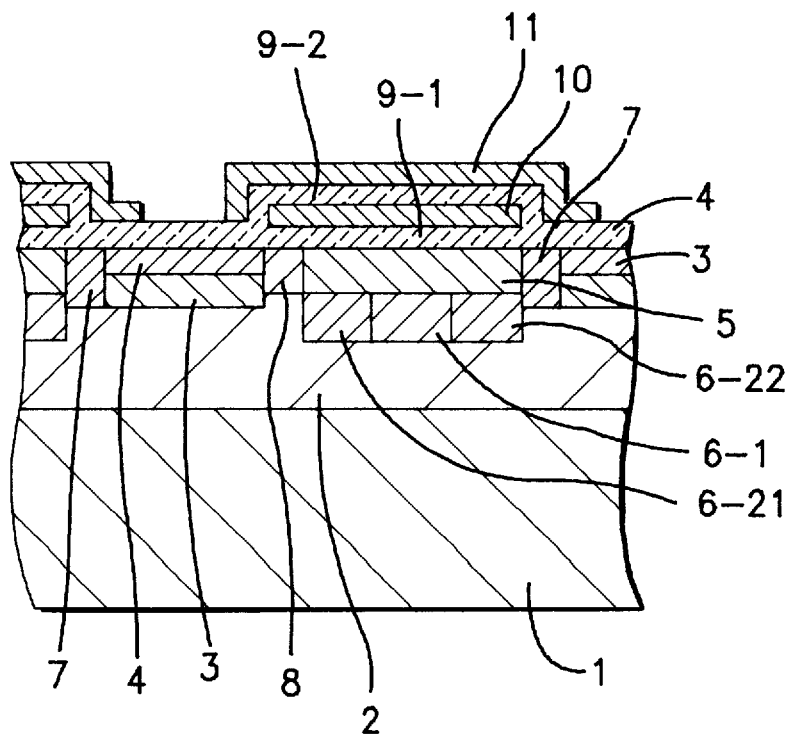
FIG. 3 is a fragmentary cross sectional elevation view illustrative of the unit pixel of a novel interline charge coupled device solid state image sensor in first and second embodiments according to the present invention.

With reference to FIG. 3, a p$^-$-well region 2 is formed over an n-type silicon substrate 1. An n-type photoelectric converter 3 is formed over the p$^-$-well region 2. The n-type photoelectric converter 3 constitutes the photo-diode 101. A p$^+$-diffusion layer 4 is provided over the n-type photoelectric converter 3 for reduction of dark current. The vertical charge coupled device resistors 102 comprises an n-type diffusion layer 5 over the n-type silicon substrate 1 and a p-type diffusion layer underlying the n-type diffusion layer 5 and in the upper region of the n-type silicon substrate 1.

The p-type diffusion layer of the vertical charge coupled device resistor 102 comprises a first p-type diffusion layer 6-1, a second p-type diffusion layer 6-21 extending in contact with a first side of the first p-type diffusion layer 6-1, and a third p-type diffusion layer 6-22 extending in contact with a second side of the first p-type diffusion layer 6-1. The first p-type diffusion layer 6-1 extends between the second and third p-type diffusion layers 6-21 and 6-22, wherein the first p-type diffusion layer 6-1 has a lower impurity concentration than the second and third p-type diffusion layers 6-21 and 6-22.

Between the photo-diode 101 and the corresponding vertical charge coupled device resistors 102, a charge read-out gate region 8 is provided. A p$^+$-type isolation layer 7 is provided at an opposite side of the photodiode 101 to the charge read-out gate region 8. An insulation film 9-1 is formed which extends over the p$^+$-diffusion layer 4, the n-type diffusion layer 5, the p$^+$-type isolation layer 7 and the charge read-out gate region 8. The insulation film 9-1 may comprise a silicon oxide film or a silicon nitride film. A transfer gate electrode 10 of the vertical charge coupled device resistor 102 is provided on the insulation film 9-1 and over the n-type diffusion layer 5. The transfer gate electrode 10 may comprise a polysilicon film. An insulation film 9-2 is further provided over the transfer gate electrode 10. An optical shielding film 11 is provided over the insulation film 9-2. The optical shielding film 11 may comprise a tungsten film or an aluminum film.

The charge or electron having been read out by the photo-diode is then transferred through the vertical charge coupled device resistor 102. As described above, in the conventional image sensor, electrons generated in the p$^-$-type well 2 in the vicinity of the n-type diffusion layer 5 were caused to enter into the n-type diffusion layer 5 through the p-type diffusion layer 6, the greatest amounts of entry being electron in the opposite side regions closer to the n-type photoelectric converter 3.

In accordance with the present invention, however, the opposite side regions of the p-type diffusion layer of the vertical charge coupled device resistor 102 have increased impurity concentrations to provide those opposite side regions of the p-type diffusion layer with risen potential barriers to electrons so as to prevent the electrons generated in the p$^-$-type well 2 in the vicinity of the n-type diffusion layer 5 from entry into the n-type diffusion layer 5. This potential barrier structure of the p-type diffusion layer prevents appearance of smear.

The charge transfer efficiency depends upon the intensity of the fringe electric field. Under the center portion of the transfer channel, the first p-type diffusion layer 6-1 is provided, which has a lower impurity concentration than the second and third p-type diffusion layers 6-21 and 6-22. A space charge region between the n-type diffusion layer 5 and the second p-type diffusion layer 6-21 has a large thickness. A space charge region between the n-type diffusion layer 5 and the third p-type diffusion layer 6-22 also has a large thickness. A p-n junction capacitance per unit area becomes small. For those reasons, a capacitance per unit area between the transfer gate electrode 10 and the n-type diffusion layer 5 becomes large. This makes large variations in potential of a part of the n-type diffusion layer 5 where signal charge is accumulated and the potential of the transfer gate electrode. As a result, the fringe electric field of the transfer channel center portion in charge transfer becomes large thereby ensuring a large transfer efficiency.

In this first embodiment, the first p-type diffusion layer 6-1 has an impurity concentration of approximately $0.8 \times 10^{16}$ cm$^{-3}$. The second and third p-type diffusion layers 6-21 and 6-22 have an impurity concentration of approximately $2.0 \times 10^{16}$ cm$^{-3}$. The first p-type diffusion layer 6-1 has a width of 1 micrometer. The second and third p-type diffusion layers 6-21 and 6-22 have a width of 1 micrometer. The n-type diffusion layer has an impurity concentration of approximately $0.8 \times 10^{17}$ cm$^{-3}$ and has a depth of 0.6 micrometers.

In the conventional image sensor, the p-type diffusion layer 6 has a uniform impurity concentration of $2.0 \times 10^{16}$ cm$^{-3}$. As compared to this conventional p-type diffusion layer 6, in this embodiment of the present invention, the amount of the residual signals which should have been transferred due to transfer error is reduced to approximately one tenth of that when the conventional p-type diffusion layer 6 were provided.

On the other hand, as to the problem with smear raised by the diffusion of electrons generated in the vicinity of the photo-diode, in accordance with the present invention, the second and third p-type diffusion layers 6-21 and 6-22 sandwiching the first p-type diffusion layer 6-1 have an increased impurity concentration of $2.0 \times 10^{16}$ cm$^{-3}$ in order to provide high potential barriers to electrons, thereby preventing the electrons generated in the vicinity of the photo-diode from entry into the n-type diffusion layer 5 through the second and third p-type diffusion layers 6-21 and 6-22 with high potential barriers to electrons. This makes the image sensor free from the problem of smear.

Accordingly, the impurity concentration of the first p-type diffusion layer is reduced to increase the fringe electric field whilst the impurity concentrations of the second and third p-type diffusion layers sandwiching the first p-type diffusion layer are increased to reduce the smear and improve the charge transfer efficiency.

A second embodiment according to the present invention will be described in detail with reference to FIGS. 1 and 3 which is illustrative of the unit pixel of a novel interline charge coupled device solid state image sensor free from a substantial decrease in smear as well as allowing an improvement in the charge transfer efficiency.

The novel interline charge coupled device solid state image sensor has the same structure as illustrated in FIG. 1. A plurality of vertical charge coupled device resistors 102 are provided in parallel to each other over a semiconductor substrate 100. Each of the vertical charge coupled device resistors 102 extends in a vertical direction. A plurality of photo-diodes 101 are aligned in the vertical direction and along each of the vertical charge coupled device resistors 102. Namely, the photo-diodes 101 are aligned between the adjacent vertical charge coupled device resistors 102. Each of the photo-diodes 101 is connected via a charge read-out gate region 103 to the horizontal charge coupled device resistor 102. A lateral charge coupled resistor 104 is provided which extends in a lateral direction. The horizontal charge coupled resistor 104 is coupled with respective end portions of the vertical charge coupled device resistors 102. A charge detecting portion 105 is provided at an end portion of the lateral charge coupled resistor 104. An output amplifier 106 is also provided to be coupled to the charge detecting portion 105. A unit pixel 107 is represented by the broken line and comprises the photo-diode 101 and the corresponding part of the vertical charge coupled device resistors 102.

When light is incident into the photo-diode 101, a photoelectric conversion of the photo-diode 101 is caused to convert the incident light into charge. The photoelectric-converted charge is transferred through the charge read-out gate region 103 into the vertical charge coupled device resistors 102. The photoelectric-converted charge is further transferred through the horizontal charge coupled resistor 104 into the charge detecting portion 105. The photoelectric-converted charge is then outputted through the output amplifier 106.

With reference to FIG. 3, a p$^-$-well region 2 is formed over an n-type silicon substrate 1. An n-type photoelectric converter 3 is formed over the p$^-$-well region 2. The n-type photoelectric converter 3 constitutes the photo-diode 101. A p$^+$-diffusion layer 4 is provided over the n-type photoelectric converter 3 for reduction of dark current. The vertical charge coupled device resistors 102 comprises an n-type diffusion layer 5 over the n-type silicon substrate 1 and a p-type diffusion layer underlying the n-type diffusion layer 5 and in the upper region of the n-type silicon substrate 1.

The p-type diffusion layer of the vertical charge coupled device resistor 102 comprises a first p-type diffusion layer 6-1, a second p-type diffusion layer 6-21 extending in contact with a first side of the first p-type diffusion layer 6-1, and a third p-type diffusion layer 6-22 extending in contact with a second side of the first p-type diffusion layer 6-1. The first p-type diffusion layer 6-1 extends between the second and third p-type diffusion layers 6-21 and 6-22, wherein the first p-type diffusion layer 6-1 has a lower impurity concentration than the second and third p-type diffusion layers 6-21 and 6-22.

Between the photo-diode 101 and the corresponding vertical charge coupled device resistors 102, a charge read-out gate region 8 is provided. A p$^+$-type isolation layer 7: is provided at an opposite side of the photo-diode 101 to the charge read-out gate region 8. An insulation film 9-1 is formed which extends over the p$^+$-diffusion layer 4, the n-type diffusion layer 5, the p$^+$-type isolation layer 7 and the charge read-out gate region 8. The insulation film 9-1 may comprise a silicon oxide film or a silicon nitride film. A transfer gate electrode 10 of the vertical charge coupled device resistor 102 is provided on the insulation film 9-1 and over the n-type diffusion layer 5. The transfer gate electrode 10 may comprise a polysilicon film. An insulation film 9-2 is further provided over the transfer gate electrode 10. A6 optical shielding film 11 is provided over the insulation film 9-2. The optical shielding film 11 may comprise a tungsten film or an aluminum film.

The charge or electron having been read out from the photo-diode is then transferred through the vertical charge coupled device resistor 102. As described above, in the conventional image sensor, electrons generated in the p$^-$-type well 2 in the vicinity of the n-type diffusion layer 5 were caused to enter into the n-type diffusion layer 5 through the p-type diffusion layer 6, the greatest amount of electron entry being in the opposite side regions closer to the n-type photoelectric converter 3.

In accordance with the present invention, however, the opposite side regions of the p-type diffusion layer of the vertical charge coupled device resistor 102 have increased impurity concentrations to provide those opposite side regions of the p-type diffusion layer with risen potential barriers to electrons so as to prevent the electrons generated in the p$^-$-type well 2 in the vicinity of the n-type diffusion layer 5 from entry into the n-type diffusion layer 5. This potential barrier structure of the p-type diffusion layer prevents appearance of smear.

The charge transfer efficiency depends upon the intensity of the fringe electric field. Under the center portion of the transfer channel, the first p-type diffusion layer 6-1 is provided, which has a lower impurity concentration than the second and third p-type diffusion layers 6-21 and 6-22. A space charge region between the n-type diffusion layer 5 and the second p-type diffusion layer 6-21 has a large thickness. A space charge region between the n-type diffusion layer 5 and the third p-type diffusion layer 6-22 also has a large thickness. A p-n junction capacitance per unit area becomes small° For those reasons, a capacitance per unit area between the transfer gate electrode 10 and the n-type diffusion layer 5 becomes large. This makes large variations in potential of a part of the n-type diffusion layer 5 where signal charge is accumulated, and the potential of the transfer gate electrode. As a result, the fringe electric field of the transfer channel center portion in charge transfer becomes large thereby ensuring a large transfer efficiency.

In this second embodiment, the first p-type diffusion layer 6-1 has an impurity concentration of approximately $1.2 \times 10^{16}$ cm$^{-3}$. The second and third p-type diffusion layers 6-21 and 6-22 have an impurity concentration of approximately $2.0 \times 10^{16}$ cm$^{-3}$. The first p-type diffusion layer 6-1 has a width of 1 micrometer. The second and third p-type diffusion layers 6-21 and 6-22 have a width of 1 micrometer. The n-type diffusion has an impurity concentration of approximately $1.0 \times 10^{17}$ cm$^{-3}$ and has a depth of 0.6 micrometers.

In the conventional image sensor, the p-type diffusion layer 6 has a uniform impurity concentration of $2.0 \times 10^{16}$ cm$^{-3}$. As compared to this conventional p-type diffusion layer 6, in this embodiment of the present invention, the amount of the residual signals which should have been transferred due to transfer error is reduced to approximately one fifth of that when the conventional p-type diffusion layer 6 were provided.

On the other hand, as to the problem with smear raised by the diffusion of electrons generated in the vicinity of the photo-diode, in accordance with the present invention, the second and third p-type diffusion layers 6-21 and 6-22 sandwiching the first p-type diffusion layer 6-1 have an increased impurity concentration of $2.0 \times 10^{16}$ cm$^{-3}$ in order to provide high potential barriers to electrons, thereby preventing the electrons generated in the vicinity of the photo-diode from entry into the n-type diffusion layer 5 through the second and third p-type diffusion layers 6-21 and 6-22 with high potential barriers to electrons. This makes the image sensor free from the problem of smear.

Accordingly, the impurity concentration of the first p-type diffusion layer is reduced to increase the fringe electric field whilst the impurity concentrations of the second and third p-type diffusion layers sandwiching the first p-type diffusion layer are increased to reduce the smear and improve the charge transfer efficiency.

In the second embodiment, the impurity concentration of the first p-type diffusion layer 6-1 has a higher impurity concentration than that of the first embodiment, for which reasons, the charge transfer efficiency is somewhat deteriorated as compared to the first embodiment. However, the maximum charge transfer amount of the image sensor of this second embodiment is 1.2 times of that of the first embodiment.

In the foregoing embodiments, it is possible to change the type of conductivity of respective layers.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A vertical charge coupled device resistor formed in an upper region of a semiconductor substrate of an interline solid state image sensor, said vertical charge coupled device resistor comprising laminations of a first conductivity type diffusion layer and a second conductivity type diffusion layer extending under the first conductivity type diffusion layer,
   wherein said second conductivity type diffusion layer varies in impurity concentration in a width direction so that opposite side regions of said second conductivity type diffusion layer are higher in impurity concentration than a center region of said second conductivity type diffusion layer.

2. The vertical charge coupled device resistor as claimed in claim 1, wherein said second conductivity type diffusion layer comprises:

a first region having a first impurity concentration;

a second region extending in contact with a first side of said first region, said second region having a second impurity concentration higher than said first impurity concentration; and a third region extending in contact with a second side of said first region, said third region having a third impurity concentration higher than said first impurity concentration.

3. The vertical charge coupled device resistor as claimed in claim 2, wherein said second and third impurity concentrations are the same as each other.

4. The vertical charge coupled device resistor as claimed in claim 3, wherein said first impurity concentration is approximately $0.8 \times 10^{16}$ cm$^{-3}$, and said second and third impurity concentrations are approximately $2.0 \times 10^{16}$ cm$^{-3}$, and wherein said first conductivity type diffusion layer has an impurity concentration of approximately $1.0 \times 10^{17}$ cm$^{-3}$.

5. The vertical charge coupled device resistor as claimed in claim 3, wherein said first impurity concentration is approximately $1.2 \times 10^{16}$ cm$^{-3}$, and said second and third impurity concentrations are approximately $2.0 \times 10^{16}$ cm$^{-3}$, and wherein said first conductivity type diffusion layer has an impurity concentration of approximately $1.0 \times 10^{17}$ cm$^{-3}$.

6. The vertical charge coupled device resistor as claimed in claim 1, wherein said second conductivity type diffusion layer increases in impurity concentration toward opposite sides thereof.

7. The vertical charge coupled device resistor as claimed in claim 1, wherein a majority carrier is electron and said first conductivity type is n-type and said second conductivity type is p-type.

8. An interline solid state image sensor comprising:

a plurality of vertical charge coupled device resistors, each of which extends in a vertical direction, said vertical charge coupled device resistors being parallel to each other;

a plurality of photo-diodes being aligned along one side of each of said vertical charge coupled device resistors so that said photo-diodes are aligned between adjacent two vertical charge coupled device resistors, each of said photo-diodes being connected via a charge read-out gate region to said vertical charge coupled device resistor, each of said vertical charge coupled device resistor comprising laminations of a first conductivity type diffusion layer and a second conductivity type diffusion layer extending under the first conductivity type diffusion layer; and a horizontal charge coupled resistor extending in a horizontal direction, said horizontal charge coupled resistor coupled with ends of said vertical charge coupled device resistors, wherein said second conductivity type diffusion layer varies in impurity concentration in said lateral direction so that opposite side regions of said second conductivity type diffusion layer are higher in impurity concentration than a center region of said second conductivity type diffusion layer.

9. The interline solid state image sensor as claimed in claim 8, wherein said second conductivity type diffusion layer comprises:

a first region having a first impurity concentration;

a second region extending in contact with a first side of said first region, said second region having a second impurity concentration higher than said first impurity concentration; and a third region extending in contact with a second side of said first region, said third region having a third impurity concentration higher than said first impurity concentration.

10. The interline solid state image sensor as claimed in claim 9, wherein said second and third impurity concentrations are the same as each other.

11. The interline solid state image sensor as claimed in claim 10, wherein said first impurity concentration is approximately $0.8 \times 10^{16}$ cm$^{-3}$, and said second and third impurity concentrations are approximately $2.0 \times 10^{16}$ cm$^{-3}$, and wherein said first conductivity type diffusion layer has an impurity concentration of approximately $1.0 \times 10^{17}$ cm$^{-3}$.

12. The interline solid state image sensor as claimed in claim 10, wherein said first impurity concentration is approximately $1.2 \times 10^{16}$ cm$^{-3}$, and said second and third impurity concentrations are approximately $2.0 \times 10^{16}$ cm$^{-3}$, and wherein said first conductivity type diffusion layer has an impurity concentration of approximately $1.0 \times 10^{17}$ cm$^{-3}$.

13. The interline solid state image sensor as claimed in claim 8, wherein said second conductivity type diffusion layer increases in impurity concentration toward opposite sides thereof.

14. The interline solid state image sensor as claimed in claim 8, wherein a majority carrier is electron and said first conductivity type is n-type and said second conductivity type is p-type.

15. A charged coupled device pixel unit comprising:
 a horizontal first conductivity type photoelectric converter formed over a second conductivity type well region constituting a photo-diode;
 a vertical resistor comprising first conductivity type diffusion horizontal layer overlaying a second conductivity type diffusion horizontal layer wherein said second conductivity type impurity concentration varies horizontally; and
 a read-out gate intermediate said photoelectric converter and said vertical resistor first conductivity type diffusion horizontal layer.

16. The pixel unit of claim 15, wherein said vertical resistor second conductivity type diffusion horizontal layer impurity concentration increases horizontally from the center of the horizontal layer toward said read-out gate.

17. The pixel unit of claim 16, wherein said vertical resistor second conductivity type diffusion horizontal layer impurity concentration increase horizontally from the center of the horizontal layer away from said read-out gate.

18. The pixel unit of claim 15, wherein said vertical resistor second conductivity type diffusion horizontal layer impurity concentration varies horizontally such that said second vertical resistor conductivity type diffusion horizontal layer exhibits a greater potential barrier to portions of said well region having greater electron density generated by said photo-diode.

19. The pixel unit of claim 15, wherein said vertical resistor second conductivity type diffusion horizontal layer impurity concentration is within the range of approximately $0.80 \times 10^{17}$ cm$^{-3}$ to approximately $1.0 \times 10^{17}$ cm$^{-3}$ in the center of the horizontal layer and approximately $2.0 \times 10^{17}$ cm$^{-3}$ away from the center of the horizontal layer.

20. The pixel unit of claim 15, wherein said vertical resistor second conductivity type diffusion horizontal layer impurity concentration increases away from the center of the horizontal layer.

* * * * *